(12) United States Patent
Wei et al.

(10) Patent No.: US 8,279,007 B2
(45) Date of Patent: Oct. 2, 2012

(54) SWITCH FOR USE IN A PROGRAMMABLE GAIN AMPLIFIER

(75) Inventors: ChangMing Wei, Shanghai (CN); Yu Zhang, Shanghai (CN); Lixin Jiang, Shanghai (CN); JinFu Chen, Shanghai (CN); Jeffrey G. Barrow, Tucson, AZ (US)

(73) Assignee: Integrated Device Technology, inc., San Jose, CA (US)

( * ) Notice: Subject to any disclaimer, the term of this patent is extended or adjusted under 35 U.S.C. 154(b) by 0 days.

(21) Appl. No.: 12/995,279

(22) PCT Filed: Oct. 21, 2010

(86) PCT No.: PCT/CN2010/001648
§ 371 (c)(1),
(2), (4) Date: Nov. 30, 2010

(87) PCT Pub. No.: WO2012/051739
PCT Pub. Date: Apr. 26, 2012

(65) Prior Publication Data
US 2012/0098597 A1      Apr. 26, 2012

(51) Int. Cl.
*H03G 3/30* (2006.01)
(52) U.S. Cl. .................................................. 330/284
(58) Field of Classification Search ............... 330/86, 330/144, 282, 284; 333/262
See application file for complete search history.

(56) References Cited

U.S. PATENT DOCUMENTS

| 4,109,213 A | 8/1978 | Fletcher |
| 5,327,098 A * | 7/1994 | Molina et al. ............... 330/254 |
| 2006/0208801 A1 | 9/2006 | Brekelmans et al. |

FOREIGN PATENT DOCUMENTS

| CN | 1297283 A | 5/2001 |
| CN | 101170280 A | 4/2008 |

OTHER PUBLICATIONS

PCT International Search Report and the Written Opinion mailed Jul. 21, 2011, in related International Application No. PCT/CN2010/001648.

* cited by examiner

*Primary Examiner* — Steven J Mottola
(74) *Attorney, Agent, or Firm* — Hayes and Boone LLP

(57) ABSTRACT

A switch circuit is provided. The switch circuit may include a first transistor having a source terminal to accept an input signal, a drain terminal to provide an output signal, and a gate; a power supply providing a gate voltage. The switch circuit may also include a circuit to couple a switch signal to the gate, wherein the circuit turns the first transistor 'off' for all values of the input signal when the switch signal is 'low.' A programmable gain amplifier (PGA) is also provided. The PGA may include an input stage having an input node to couple an input signal, and an output node to provide a gate signal, at least a first gain stage including a resistor and a switch circuit as above. A differential gain amplifier may be included to provide an output signal from the gain signal.

14 Claims, 9 Drawing Sheets

US 8,279,007 B2

SWITCH FOR USE IN A PROGRAMMABLE GAIN AMPLIFIER

BACKGROUND

1. Technical Field

Embodiments disclosed herein relate to the field of switch circuits for use in programmable gain amplifiers. More particularly, embodiments of the present disclosure relate to programmable gain amplifiers that may handle high input swing signals, including negative voltages.

2. Description of Related Art

In current technological applications of programmable gain amplifiers (PGAs), such as in power meters and temperature sensors, a high input voltage swing is becoming a common occurrence. Generally, a closed loop PGA including operational amplifiers (op-amps), switches and resistors has been employed to handle this high input voltage swing. The switches are used to select the gain level desired for a certain input signal. Linearity of the response of the PGA device is desired in order to keep the appropriate performance over a wide range of input values. In most cases, switches used in the prior art are transistor-based devices that may not be able to turn completely 'off' due to leakage currents within the transistors. The inability of some of the switches to turn 'off' in some cases may lead to a nonlinear response of the amplifier, especially when a high input swing is being received.

What is needed is a switch circuit that may turn completely 'off' for a wide input voltage swing in a programmable gain amplifier, including negative voltages.

BRIEF SUMMARY

A switch circuit according to some embodiments may include a first transistor having a source terminal to accept an input signal, a drain terminal to provide an output signal, and a gate; a power supply providing a first gate voltage; and a circuit to couple a switch signal to the gate; wherein the circuit turns the first transistor 'off' for all values of the input signal when the switch signal is 'low.'

A programmable gain amplifier according to some embodiments may include an input stage having an input node to couple an input signal, and an output node to provide a gate signal; at least a first gain stage to provide a gain signal using the input signal, including a resistor and a switch circuit to activate the gain stage and provide a gain signal using a switch signal. A differential gain amplifier may be included to provide an output signal from the gain signal; and further wherein the resistor in the first gain stage may be coupled to the input node in the input stage. The gate signal in the output node may be coupled to the switch circuit in the first gain stage so that the switch circuit is 'off' for all values of the input signal when the switch signal is 'low.'

A method for using a processor chip to control a switch in a programmable gain amplifier (PGA), the PGA including an input stage, at least one gain stage including a switch and a transistor, and an amplifier, may include the step of receiving at the input stage of the PGA an input signal and generating, by the PGA, a gate signal from the input signal, consistent with embodiments described herein. Further, the steps of setting an iteration parameter to 'one' by the processor chip; selecting a gain stage based on the iteration parameter and providing an input signal to the gain stage may be included in some embodiments. The steps of determining whether a switch signal is 'on' or 'off' for the selected gain stage; if the switch signal is 'off' providing a gate signal to the transistor in the switch of the selected gain stage to turn the switch 'off,' increasing the iteration parameter by one and selecting the next gain stage by the processor until all gain stages in the PGA have been selected may also be included in some embodiments. If the switch signal is 'on' the step of providing a gain signal to the amplifier in the PGA circuit from the selected gain stage may also be included in some embodiments.

These and other embodiments will be described in further detail below, with reference to the following drawings.

BRIEF DESCRIPTION OF THE DRAWINGS

Wherever possible, the same reference numbers are used throughout the drawings to refer to the same or like elements.

DETAILED DESCRIPTION

In current applications, the linearity of a programmable gain amplifier (PGA) is a highly desirable characteristic. One manifestation of the nonlinear behavior of a PGA is the appearance of strong high order harmonics in the spectral decomposition of the output signal from a PGA. Higher order harmonics may produce signal artifacts that interfere with true signals at a higher frequency. Higher order harmonics may also weaken the true signal in the fundamental tone (main frequency component) by taking energy away from the fundamental tone into higher harmonics. This may reduce the detection efficiency or the generation efficiency of a signal. The linearity of a PGA is dependent on the strength of the input signal to the PGA. In many instances, the output of a PGA may be linear, provided the range of the input voltage (input 'swing') is small enough. However, many current applications of PGAs may place devices in environments having large input voltage swings, compelling device designers to include extra circuitry for the linearization of output signals.

Figure 1:
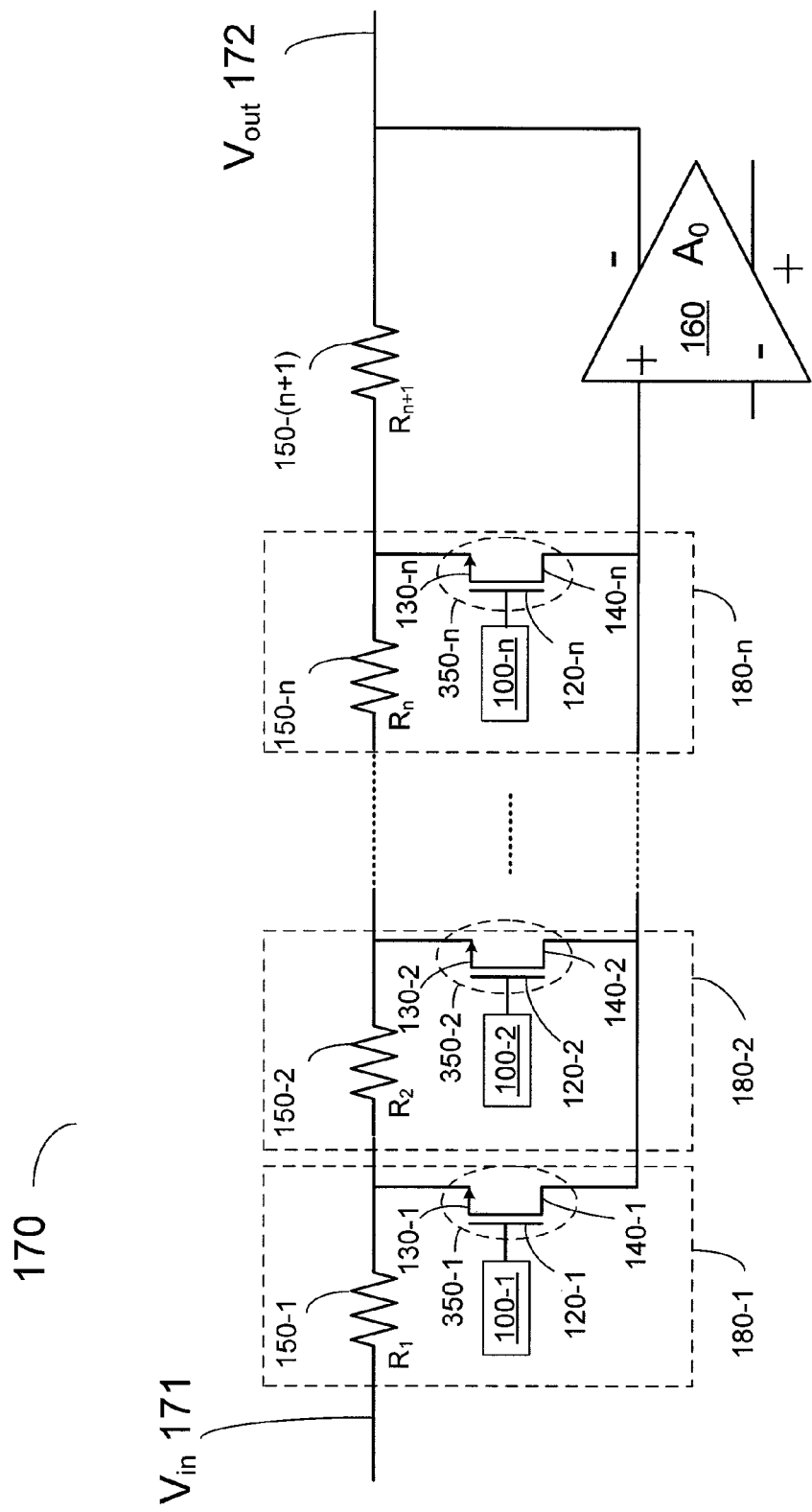
FIG. 1 shows a programmable gain amplifier (PGA) using a differential gain amplifier and gain stages according to some embodiments.

FIG. 1 shows programmable gain amplifier (PGA) 170 using differential gain amplifier 160 and gain stages 180-1 to 180-*n*. The number of gain stages 'n' used in PGA 170 may vary according to device application. Each of gain stages 180-*i* includes a resistor 150-*i*, and a switch input voltage 100-*i*, where 'i' denotes an arbitrary stage between 1 and n. The gain of PGA 170, defined as the ratio between $V_{out}$ 172 and $V_{in}$ 171, can be programmed by changing the switch settings. For example, when switch input 100-*i* is 'high' and all other switch inputs are 'low,' the gain from PGA 170 is:

$$\text{gain} = -\frac{V_{out}}{V_{in}} = -\sum_{k=i+1}^{n+1} R_k \bigg/ \sum_{j=1}^{i} R_j, \quad (1)$$

where $R_1$ to $R_n$ are the values of resistors 150-1 to 150-*n*, respectively. Switch signals 100-1 to 100-*n* in FIG. 1 may be coupled to NMOS transistors, according to some embodiments. FIG. 1 shows the part of the circuit that feeds the positive portion of differential gain amplifier 160. In some embodiments, a similar circuit having transistor switches and resistors as shown in FIG. 1 is coupled to the negative portion of differential gain amplifier 160. For example, if the positive portion of differential gain amplifier includes NMOS transistor switches as depicted in FIG. 1, the negative portion of differential gain amplifier 160 may include PMOS transistor switches.

Transistors 350-1 to 350-*n* coupled to switch signals 100-1 to 100-*n* in FIG. 1 may include gate connections 120-1 to 120-*n*, source connections 130-1 to 130-*n*, and drain connections 140-1 to 140-*n*. Note that in the embodiment depicted in FIG. 1, transistors 350-1 to 350-*n* are NMOS transistors. In some embodiments, transistors 350-1 to 350-*n* may be PMOS transistors. Moreover, in some embodiments, terminals 130-1 to 130-*n* may be drain terminals and terminals 140-1 to 140-*n* may be source terminals. The linearity of PGA 170 may be indicated by a constant gain value (Eq. 1), for a wide range of input voltages 171. However, when switch signals 100-1 to 100-*n* are coupled to transistor-based switches 350-1 to 350-*n* as depicted in FIG. 1, the linearity of PGA 170 may be compromised under certain circumstances. For example, for certain values of input voltage 171, some of the transistors 350-1 to 350-*n* may not be completely turned 'off,' as desired.

Figure 2:
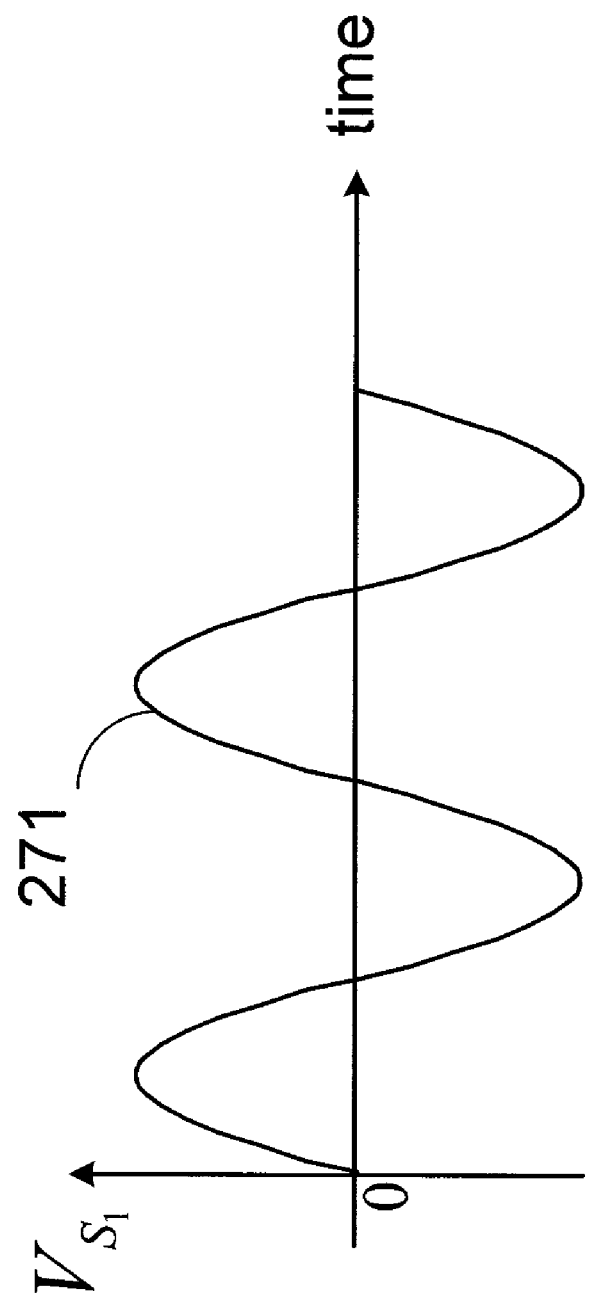
FIG. 2 shows an input waveform for a programmable gain amplifier according to some embodiments.

FIG. 2 shows input waveform 271 for programmable gain amplifier 170, according to some embodiments. As an example of PGA 170, a power measurement system may be considered. In FIG. 2, input signal 271 may include a high swing sine wave having a 0V common voltage. Voltage at gates 120-1 to 120-*n* may be referenced to the 0V common voltage of input signal 271. The design of PGA 170 may use only one transistor switch to be 'on' at a given time, for example the transistor controlled by switch input 100-*n*. Thus, all other transistor switches may have their gates 120-1 to 120-(*n*−1) at 0V. But with input signal 271, source voltage 130-1 at stage 180-1 may be negative during half of the period of signal 271. In this scenario, having the threshold voltage of the NMOS transistor in stage 180-1 equal to $V_{Th}$, it may occur that $V_{120-1} - V_{130-1} > V_{Th}$. Thus, a conducting channel may be formed between drain 140-1 and source 130-1, leading to a current flow between these two elements. And transistor switch in stage 180-1 ceases to be in an 'off' state. This may drastically change the value of the voltage drop across resistor 150-1 ($R_1$), compromising the linearity of PGA 170.

Figure 3:
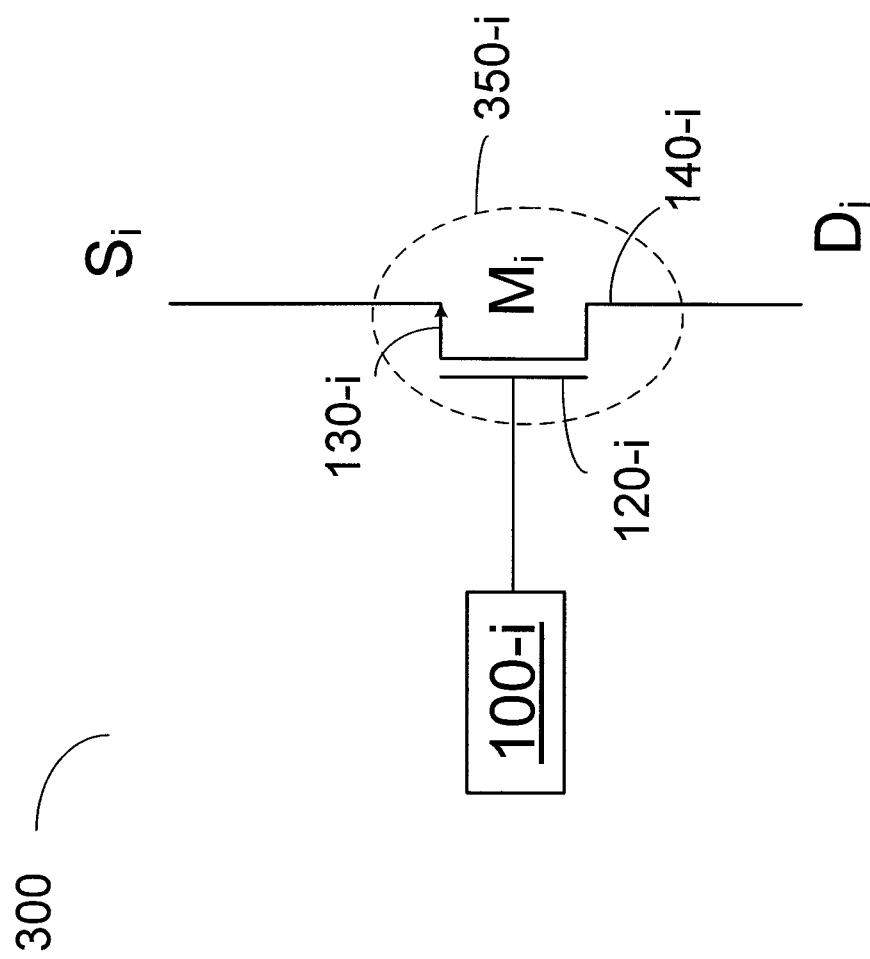
FIG. 3 shows a transistor-based switch for use in a PGA according to some embodiments.

FIG. 3 shows transistor-based switch 300 for use in PGA 170 according to some embodiments. Switch 300 may be included in gain stage 180-*i* of PGA 170, according to the embodiment depicted in FIG. 1 above. The value of 'i' may be any integer between 1 and 'n,' where 'n' is the total number of gain stages in PGA 170. Transistor 350-*i* (labeled $M_i$) may be an NMOS transistor having three terminals: gate 120-*i*, source 130-*i* ($S_i$), and drain 140-*i* ($D_i$). Switch signal 100-*i* is applied to gate 120-*i* of transistor 350-*i*. When signal 100-*i* is 'high,' transistor 350-*i* is turned 'on' and a current flows between source 130-*i* and drain 140-*i*. However, as mentioned above, even if signal 100-*i* is set at 0V, source 130-*i* may be set at a negative voltage and transistor 350-*i* may conduct current and be 'on.' This result is not desirable.

One of the desirable results for PGA 170 having amplification stages 180-1 to 180-*n* as depicted in FIG. 1 is that gate voltages 120-1 to 120-*n* follow input voltage 171 when input voltage 171 becomes negative. If input voltage 171 becomes positive, it is desirable that the gate voltage of transistor 350-*i* is set to 0V, unless a 'high' switch voltage 100-*i* is provided (where 'i' is any integer between 1 and 'n'). Switches 300 in stages 180-1 to 180-*n* may remain 'off' in all circumstances unless a 'high' switch signal 100-*i* is applied to turn one of the switches 300 'on', as desired (namely, the i-th stage).

Figure 4:
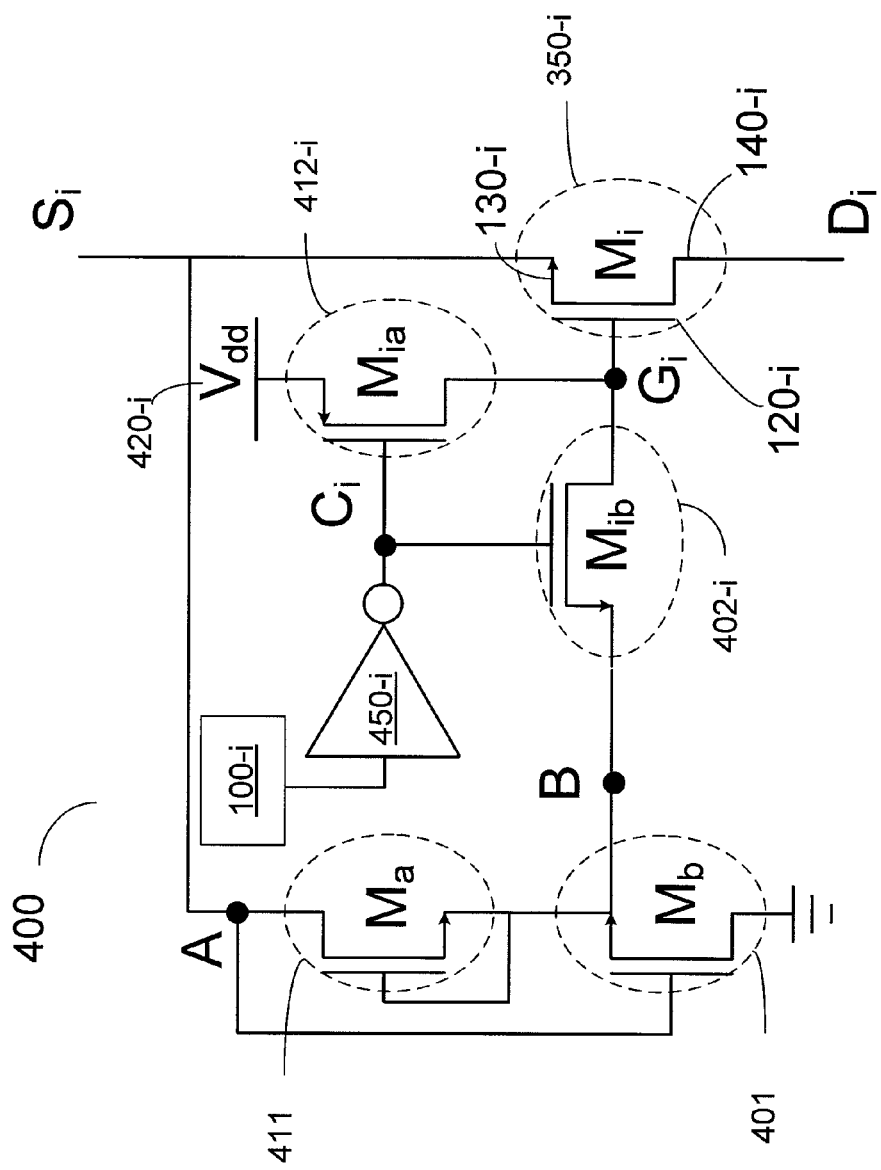
FIG. 4 shows a transistor-based switch according to some embodiments.

FIG. 4 shows a transistor-based switch 400 to replace switch 300 (cf. FIG. 3) according to some embodiments. Switch 400 may be included in the i-th gain stage of a PGA including stages from 1 to 'n,' where 'n' may be any number of stages. Switch 400 may include NMOS transistor 350-*i* (cf. FIG. 3), coupled to PMOS transistor 412-*i* ($M_{ia}$), NMOS transistors 411 ($M_a$), 401 ($M_b$) and 402-*i* ($M_{ib}$), inverter 450-*i*, and switch signal 100-*i*. Switch 400 may be powered by $V_{dd}$ voltage 420-*i*, and may have source terminal 130-*i* ($S_i$) and drain terminal 140-*i* ($D_i$). Note that, according to the embodiment depicted in FIG. 4, there may be only one of transistors 411 ($M_a$) and 401 ($M_b$) in a multi-stage PGA circuit such as will be described in more detail in relation to FIG. 7. However, according to some embodiments, transistors 411 ($M_a$) and 401 ($M_b$) may be present in one or more stages of a multi-stage PGA circuit.

Returning to FIG. 4, NMOS transistors 411 and 401 may be present on the first switch stage 400-1 of PGA circuit 170 (cf. FIG. 1, above) to receive input signal 171 ($V_{in}$). The gate of transistor 401 is coupled to input node A, and the gate and source of transistor 411 are coupled to node B. Furthermore, input node A may be coupled to the drain of transistor 411, and the drain of transistor 401 may be coupled to ground. In some embodiments, switch 400 may not include NMOS transistors 411 and 401. In addition, although transistors 411 and 401 in FIG. 4 are indicated as being NMOS transistors, such designations are exemplary only, and other arrangements of MOS transistors may be used consistent with some embodiments.

Figure 5:
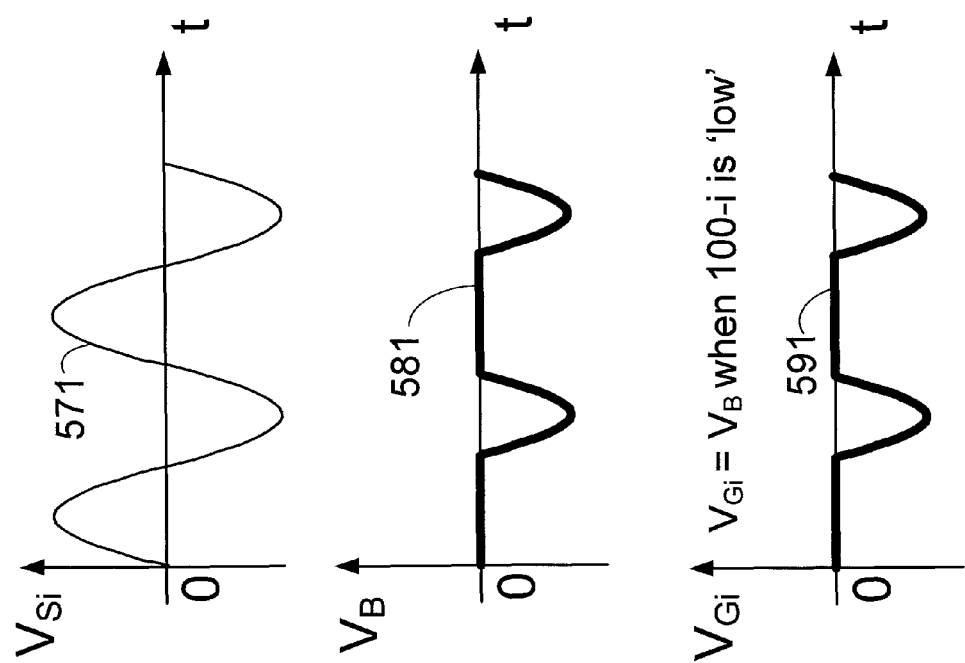
FIG. 5 shows an input waveform, an internal waveform, and a gate signal waveform when switch signal is 'Low,' for a transistor-based switch according to some embodiments.

FIG. 5 shows input waveform 571 ($V_{Si}$), intermediate waveform 581 ($V_B$), and gate signal waveform 591 ($V_{Gi}$) when switch signal 100-*i* is 'Low,' for transistor-based switch 400, according to some embodiments. Waveform 571 may be the value of the signal voltage at node $S_i$, and waveform 581 may be the voltage value at node B in switch 400 (cf. FIG. 4). According to some embodiments, such as depicted in FIG. 4, the impedance seen at node B from the source of transistor 402-*i* may be high because either one of transistors 412-*i* or 402-*i* may be turned 'off.' When transistor 412-*i* is 'on' due to a low value of voltage at node $C_i$, then transistor 402-*i* may be 'off.' Likewise, when transistor 412-*i* is 'off' due to a high voltage value at node $C_i$, then transistor 402-*i* may be 'on.' When transistor 402-*i* is 'on' it may provide gate signal 591 to transistor 350-*i* at node $G_i$, through the voltage of node B. Because of the high impedance of the source of transistor 402-*i* relative to node B, then the voltage of node B may be determined by the voltage at node $S_i$ and the resistance of transistors 411 ($M_a$) and 401 ($M_b$).

The operation of switch 400 as depicted in FIG. 4 is such that when waveform 571 is positive, waveform 581 is zero, as follows. When waveform 571 is positive, then NMOS transistor 411 ($M_a$) is 'off' and NMOS transistor 401 ($M_b$) is 'on'. Transistor 401 then couples node B to ground (0V). When waveform 571 is positive, it may still be lower than the threshold voltage, $V_{Th}$, of transistor 401. In this situation, at node B the impedance between source and drain in transistor 401 may be much lower than the impedance between source and drain in transistor 411. The result is that under the circumstance of $0<V_{Si}<V_{Th\_Mb}$, the voltage at node B is coupled to ground (0V).

Moreover, when waveform 571 is negative, waveform 581 follows waveform 571 and is also negative, as follows. When waveform 571 is negative, the source and drain of NMOS 411 ($M_a$) exchange roles and NMOS 411 ($M_a$) is 'on,' NMOS 401 ($M_b$) is 'off,' and transistor 411 couples node B to input waveform 571 ($V_{Si}$). In some circumstances waveform 571 may be negative but larger than the negative value of the threshold voltage of transistor 411 ($M_a$), that is: $-V_{Th\_Ma}<V_{Si}<0$. In this situation, at node B the impedance between drain and source in transistor 411 may be lower than the impedance between drain and source in transistor 401. Therefore, the voltage at node B may be closer to waveform 571 ($V_{Si}$) and follow $V_{Si}$ (which may be negative).

According to some embodiments, such as depicted in FIG. 4, switch 400 may be turned 'off;' that is, the voltage signal 100-$i$ provided to inverter 450-$i$ in switch 400 may be 0V, or 'Low' (cf. FIG. 4). Then, waveform 581 representing the voltage value at node B may also represent the voltage value at node $G_i$, which is coupled to gate 120-$i$ of NMOS transistor 350-$i$. This is depicted as waveform 591 in FIG. 5, as follows. When voltage 100-$i$ is 'low' (0 V), then inverter 450-$i$ puts node $C_i$ at high voltage. Thus, NMOS transistor 402-$i$ ($M_{ib}$) is above threshold value, turned 'on' while PMOS transistor 412-$i$ is 'off'. The voltage of node G; is then coupled to the voltage of node B. Thus, when switch signal at 100-$i$ is 'Low,' the voltage at node $G_i$ ($V_{Gi}$) follows voltage $V_B$ according to trace 591 in FIG. 5. This, in turn, results in transistor 350-$i$ being 'off' regardless of the swing of input waveform 571 (which may be negative).

According to some embodiments, such as depicted in FIG. 4, switch 400 may be turned 'on;' that is, the voltage signal 100-$i$ provided to inverter 450-$i$ in switch 400 may be 'high.' Then, inverter 450-$i$ sets voltage at node $C_i$ to 'Low,' turning PMOS transistor 412-$i$ ($M_{ia}$) 'on' while NMOS transistor 402-$i$ is 'off.' When transistor $M_{ia}$ is 'on,' voltage 420-$i$ ($V_{dd}$) is coupled to gate 120-$i$ of NMOS transistor 350-$i$, turning transistor 350-$i$ 'on.' According to some embodiments, $0<V_{Th\_Mi}<V_{dd}$. Thus, transistor 350-$i$ will turn 'on' regardless of the value of $V_{Si}$, whenever switch voltage 100-$i$ is 'High.'

Figure 6:
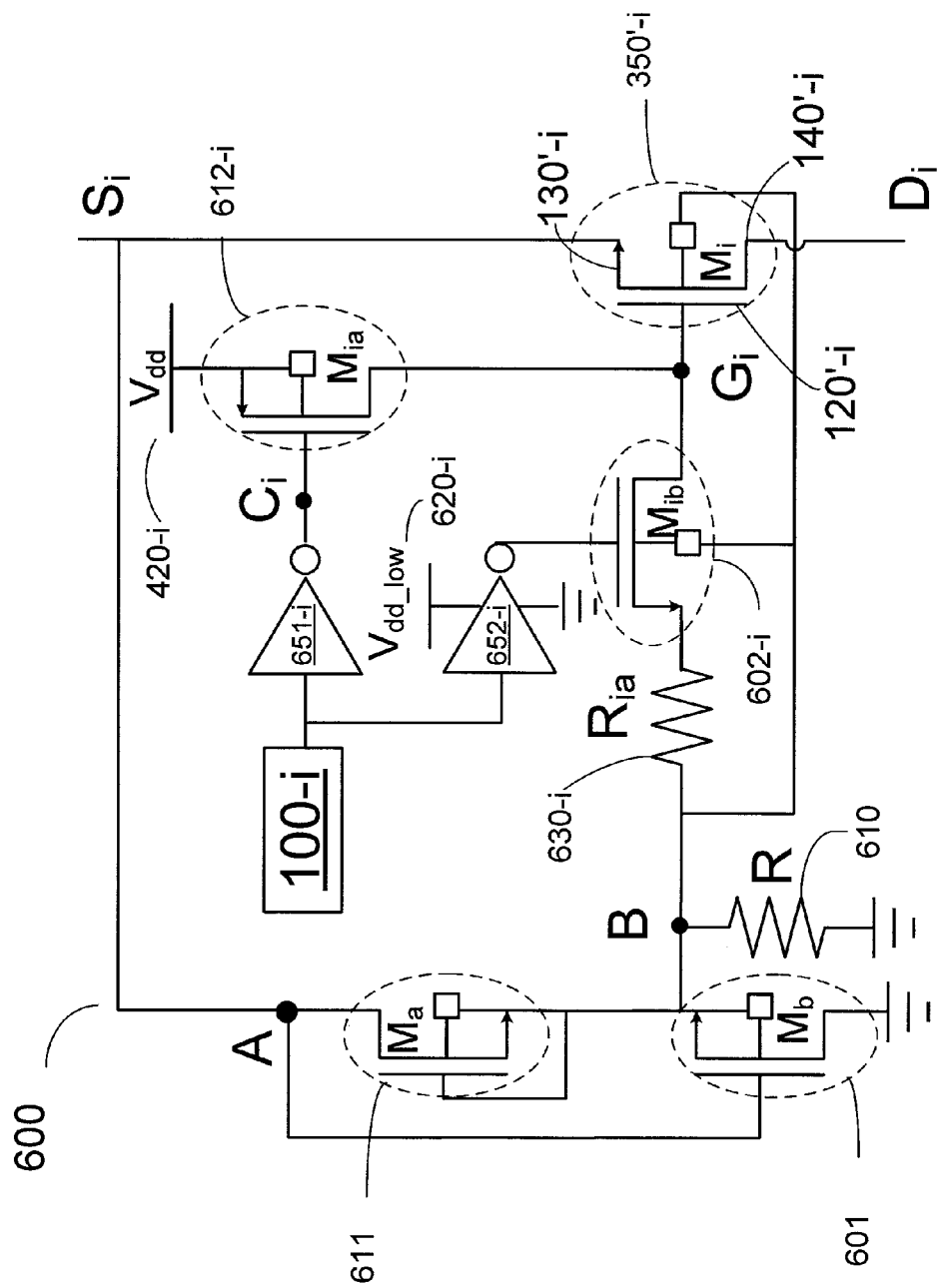
FIG. 6 shows a transistor-based switch according to some embodiments.

FIG. 6 shows transistor-based switch 600 according to some embodiments. Switch 600 may be included in the i-th gain stage of a PGA including stages from 1 to 'n,' where 'n' may be any number of stages. Switch 600 may include NMOS transistor 350'-$i$, NMOS transistors 611 ($M_a$) and PMOS transistor 612-$i$ ($M_{ia}$), NMOS transistors 601 ($M_b$) and 602-$i$ ($M_{ib}$), inverters 651-$i$ and 652-$i$, and switch voltage 100-$i$. Switch 600 may further include power supply $V_{dd}$ at voltage 420-$i$, and power supply $V_{dd-low}$ at voltage 620-$i$. NMOS Transistor 350'-$i$ has source terminal 130'-$i$ ($S_i$), drain terminal 140'-$i$ ($D_i$) and may have its substrate coupled to node B. Note that, according to the embodiment depicted in FIG. 6, there may be only one of transistors 611 ($M_a$) and 601 ($M_b$) in a multi-stage PGA circuit such as will be described in more detail in relation to FIG. 7. However, according to some embodiments, transistors 611 ($M_a$) and 601 ($M_b$) may be present in one or more stages of a multi-stage PGA circuit.

According to some embodiments, NMOS transistor 611 and NMOS transistor 601 may be an input stage placed before the first gain stage 780-1 of PGA circuit 770 (cf. FIG. 7, below) to receive input signal 771 ($V_{in}$). In some embodiments such as depicted in FIG. 6, the role of transistors 611 ($M_a$) and 601 ($M_b$) is similar to the role of transistors $M_a$ and $M_b$ in FIG. 4. Namely, the gate of transistor 601 is coupled to node A, and the gate and source of transistor 611 are coupled to node B. According to some embodiments, such as depicted in FIG. 6, the impedance seen at node B from the source of transistor 602-$i$ may be high because either one of transistors 612-$i$ or 602-$i$ may be turned 'off.' When transistor 612-$i$ is 'on' due to a low value of voltage at node $C_i$, then transistor 602-$i$ may be 'off'. Likewise, when transistor 612-$i$ is 'off' due to a high voltage value at node $C_i$, then transistor 602-$i$ may be 'on.' When transistor 602-$i$ is 'on,' it may provide gate signal 591 to transistor 350'-$i$ at node $G_i$, equal to the voltage at node B. Because of the high impedance of the source of transistor 602-$i$ relative to node B, then the voltage of node B may be determined by the voltage at node $S_i$ and the resistance of transistors 611 ($M_a$) and 601 ($M_b$). Furthermore, node A may be coupled to the drain of transistor 611, and the drain of transistor 601 may be coupled to ground. Thus, the configuration of transistors 611 and 601 induce node B to follow waveform 581 after input waveform 571 is applied at node Si (cf. FIG. 5), as follows.

When waveform 571 is positive, then NMOS transistor 611 ($M_a$) is 'off' and NMOS transistor 601 ($M_b$) is 'on.' Transistor 601 then couples node B to ground (0V). When waveform 571 is positive, it may still be lower than the threshold voltage, $V_{Th\_Mb}$, of transistor 601. In this situation, at node B the impedance between source and drain in transistor 601 may be lower than the impedance between source and drain in transistor 611. The result is that under the circumstance of $0<V_{Si}<V_{Th\_Mb}$, the voltage at node B may be coupled to ground (0V).

Moreover, when waveform 571 is negative, waveform 581 follows waveform 571 and is also negative, as follows. When waveform 571 is negative, the source and drain of NMOS 611 exchange roles and NMOS 611 ($M_a$) is 'on,' NMOS 601 ($M_b$) is 'off,' and transistor 611 couples node B to input waveform 571 ($V_{Si}$). In some circumstances waveform 571 may be negative but larger than the negative value of the threshold voltage of transistor 611 ($M_a$), that is: $-V_{Th\_Ma}<V_{Si}<0$. In this situation, at node B the impedance between drain and source in transistor 611 may be lower than the impedance between drain and source in transistor 601. Therefore, the voltage at node B may be closer to waveform 571 ($V_{Si}$) and follow $V_{Si}$ (which may be negative).

In some embodiments, such as depicted in FIG. 6, PMOS transistor 612-$i$ may couple voltage 420-$i$ (Vdd) to gate 120'-$i$ of transistor 350'-$i$, at node G. Transistor 612-$i$ is turned 'on' by a 'low' voltage at node $C_i$, which may result from providing a 'high' voltage switch signal 100-$i$ to inverter 651-$i$ in switch 600. In some embodiments, NMOS transistor 602-$i$ may couple node B to gate 120'-$i$ of transistor 350'-$i$. Transistor 602-$i$ is turned 'on' with a 'high' voltage 620-$i$ ($V_{dd-Low}$) provided by inverter 652-$i$ when a 'low' voltage switch signal 100-$i$ is coupled to switch 600.

According to some embodiments, such as depicted in FIG. 6, NMOS transistors 611, 601, 602-$i$, and 350'-$i$ may be NMOS deep n-well transistors with their substrates coupled to node B. The deep n-well of these NMOS transistors may be connected to Vdd to eliminate the leakage current from the chip substrate. Further according to some embodiments depicted in FIG. 6, a resistor 610 (R) coupling node B to ground (0V) may be included. Resistor 610 may have the effect of reducing the impedance of node B when input voltage $V_{Si}$ is close to 0V as in some portions of waveform 571. Thus, node B may still be coupled to 0V for values of $V_{Si}$ that may be positive but lower than $V_{Th\_Mb}$. Coupling node B to 0V for low values of $V_{Si}$ may reduce interference with the operation of switch 600 induced by external circuits.

In some embodiments of switch 600, such as depicted in FIG. 6, resistor 630-$i$ ($R_{ta}$) may be placed between node B and the source of NMOS transistor 602-$i$. This configuration may prevent leakage current in transistor 602-$i$ leading to a short circuit between node $G_t$ and node B when the gate voltage of transistor 602-$i$ is zero and node B is negative.

According to some embodiments of switch 600, such as depicted in FIG. 6, power supply $V_{dd\_low}$ may provide a voltage 620-$i$ that is positive and lower than voltage 420-$i$, provided by power supply $V_{dd}$. That is, in some embodiments: $0<V_{dd\_low}<V_{dd}$. Having voltage 620-$i$ lower than voltage 420-$i$ may reduce the risk of gate-source breakdown at transistor 602-$i$. This may be beneficial in some embodiments, especially when a positive gate voltage is provided to NMOS transistor 602-$i$ while node B is following a large negative swing on input waveform 571 (cf. FIG. 5).

Figure 7:
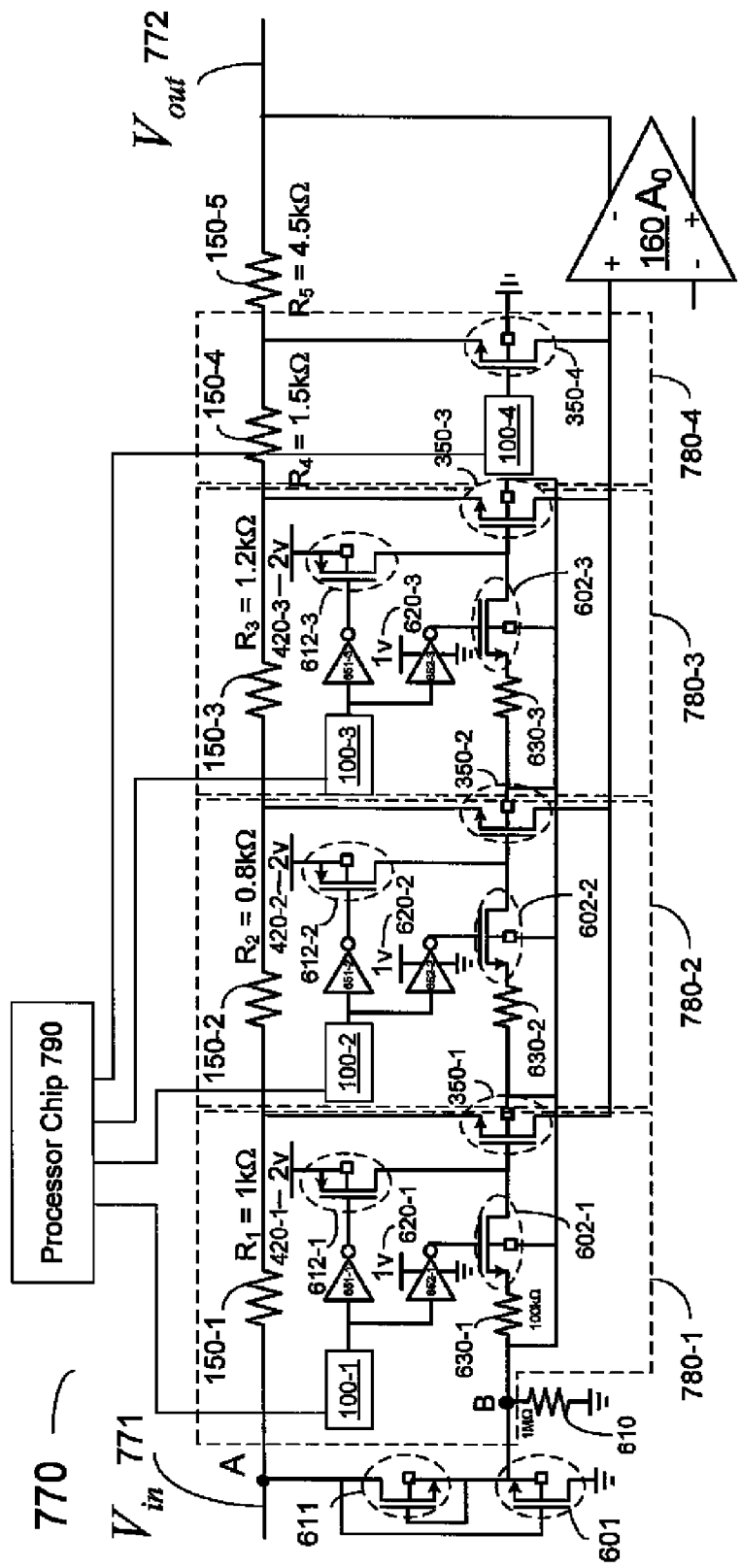
FIG. 7 shows a PGA using a differential gain amplifier and transistor-based switches, according to some embodiments.

FIG. 7 shows PGA 770 using differential gain amplifier 160 and gain stages 780-1, 780-2, 780-3, and 780-4. Although FIG. 7 only shows four gain stages, PGA 770 may include more or less than four gain stages. Indeed, similar to other embodiments disclosed herein, PGA may include 'n' gain stages. Gain stages 780-1, 780-2, and 780-3 include switch 600 (cf. FIG. 6), and gain stage 780-4 includes switch 300 (cf. FIG. 3), according to some embodiments. The description of the components and operation of gain stages 780-1, 780-2, and 780-3 is provided above in relation to FIG. 6. The description of the components and operation of gain stage 780-4 is provided above in relation to FIG. 3. Furthermore, the description of transistors 611 and 601 coupled to input waveform 771, to ground, and to node B, is also provided above in relation to FIG. 6. Node B as shown in FIG. 7 is described in detail with relation to FIG. 6.

According to the embodiment depicted in FIG. 7, voltages 420-1, 420-2, and 420-3 correspond to $V_{dd}$, which may, for example, be 2 V. Voltages 620-1, 620-2, and 620-3 correspond to $V_{dd\_low}$, which may, for example, be 1 V. Resistor 150-1 may, for example, be 1 kΩ resistor 150-2 may, for example, be 0.8 kΩ; resistor 150-3 may, for example, be 1.2 kΩ resistor 150-4 may, for example, be 1.51 kΩ; and resistor 150-5 may, for example, be 4.5 kΩ. With this resistor configuration, the gain modes that may be achieved with PGA 770 may, for example, be: 1× (switch 300 in stage 780-4 'on', all other switches 'off'); 2× (switch 600 in stage 780-3 'on', all other switches 'off'); 4× (switch 600 in stage 780-2 'on', all other switches 'off'); and 8× (switch 600 in stage 780-1 'on', all other switches 'off'). In some embodiments, such as described in FIG. 7, stage 780-4 may include switch 300 as described in FIG. 3 because in some embodiments the source of transistor 350-4 is unlikely to become negative during the operation of PGA 770. In the embodiment shown in FIG. 7, stage 780-4 is the last stage in the amplification circuit, and thus the source voltage may be coupled to input voltage 771 through a relatively large series of resistors. If input voltage 771 is negative, the resulting voltage at the source of transistor 350-4, although negative, may be very low. Therefore, the condition $V_{gate}-V_{source}<V_{Th\_350-4}$, may not occur in some embodiments, as depicted in FIG. 7.

According to some embodiments, such as depicted in FIG. 7, resistor 610 may, for example, be R=1 MΩ and resistors 630-1, 630-2 and 630-3 may all be equal to 100 kΩ. These resistor values are exemplary only, and other values may be used according to some embodiments. Some embodiments may use a transistor 611 having a channel length/width given by 50.0/0.2 μm. Furthermore, some embodiments may use a transistor 601 having a channel length/width that may, for example, be 1.0/1.0 μm. Further, some embodiments may include transistors 612-1, 612-2, 612-3, and 602-1, 602-2, and 602-3 having, for example a channel length/width of 1.0/1.0 μm. These channel length/width values are exemplary only, and other values may be used in some embodiments, according to the application of PGA 770.

In the embodiment depicted in FIG. 7, input signal 771 may swing from several micro-volts up to several hundred millivolts, depending on the different applications where PGA 770 may be used. In some embodiments, input signals 771 having amplitudes of up to 600 mV or 800 mV, with a 0V common voltage, may be encountered.

Figure 8:
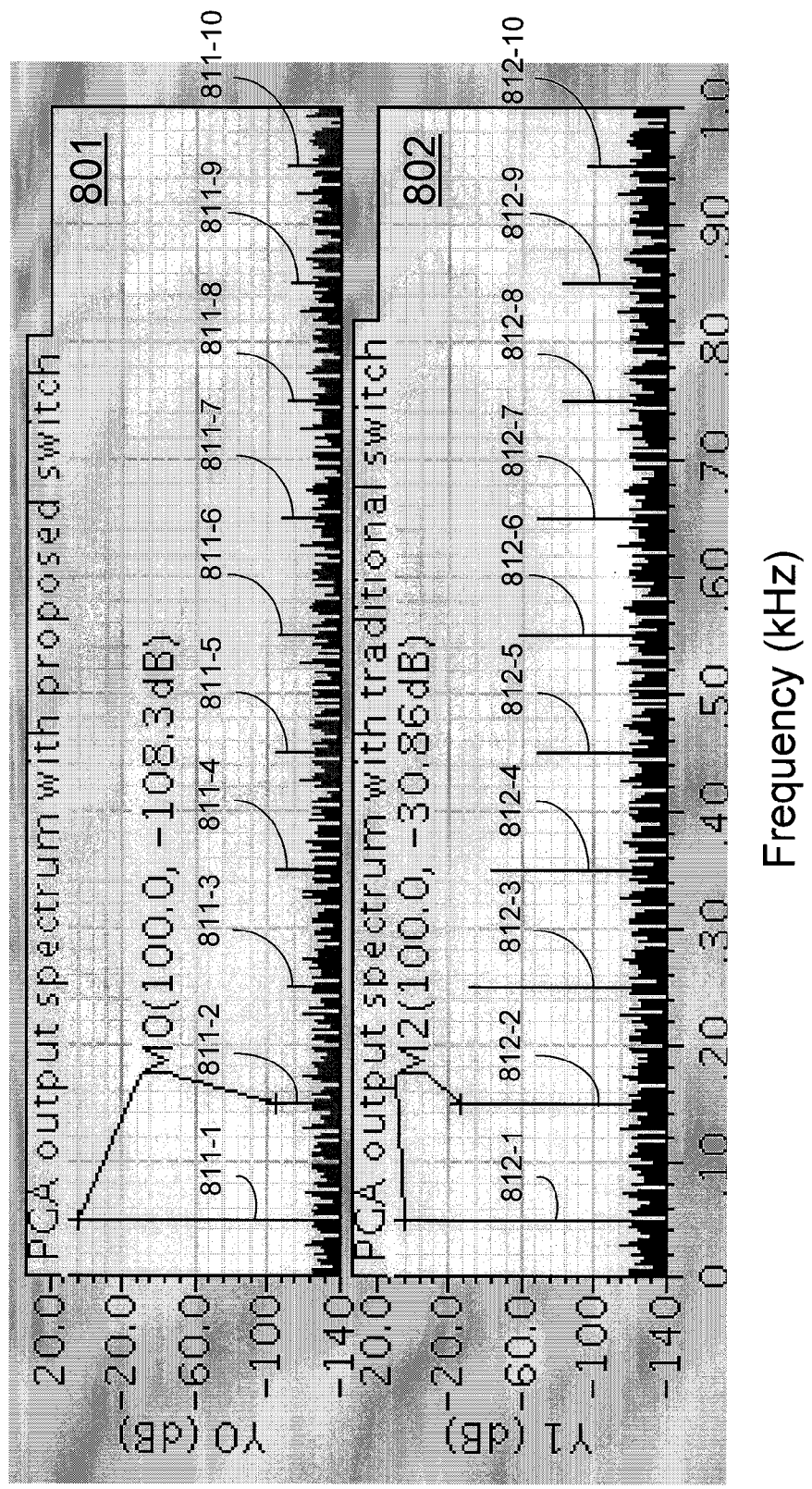
FIG. 8 shows the total harmonic distortion (THD) of a PGA according to some embodiments, compared to the THD of a PGA according to FIG. 1.

FIG. 8 shows the total harmonic distortion 801 (THD) of PGA 770 according to some embodiments such as depicted in FIG. 7. FIG. 8 also shows THD 802 of PGA 170 according to the embodiment depicted in FIG. 1. The input signal used to obtain THD 801 and THD 802 is a 1.6V fully differential, 50 Hz sine waveform. The single-end lowest voltage is −0.8 V. The harmonic distortion generated by PGA 770 and PGA 170 is shown by a series of peaks at higher frequencies from the fundamental tone at 50 Hz. The higher order peaks have diminishing amplitude, and each peak is separated in frequency from the previous one by about 100 Hz. Harmonic peaks 811-1 to 811-10 in THD 801 are generated by PGA 770, while harmonic peaks 812-1 to 812-10 in THD 802 are generated by PGA 170. The ratio of the amplitude between third harmonic 811-2 and fundamental tone 811-1 in output waveform 772 of PGA 770 is −108.3 dB. That is, the third harmonic is more than $10^{10}$ times weaker than the fundamental tone in the output of PGA 770, according to some embodiments. By comparison, the ratio of the amplitude between third harmonic 812-2 and fundamental tone 812-1 in output waveform 172 of PGA 170 is −30.86 dB. That is, the third harmonic is less than $10^4$ times weaker than the fundamental tone in the output of PGA 170. Thus, the suppression of the third harmonic in PGA 770 including gain stages 780-$i$ according to embodiments described herein may be a factor of 77 dB superior to the suppression observed in the embodiment shown in FIG. 1. In this description, the following relation between a factor 'y' and its equivalent 'x' in dB is used:

$$y=10^{x/10} \qquad (2)$$

Thus, the nonlinear suppression factor of PGA 770 is more than $10^7$ (ten million) times greater than the nonlinear suppression factor of PGA 170.

Figure 9:
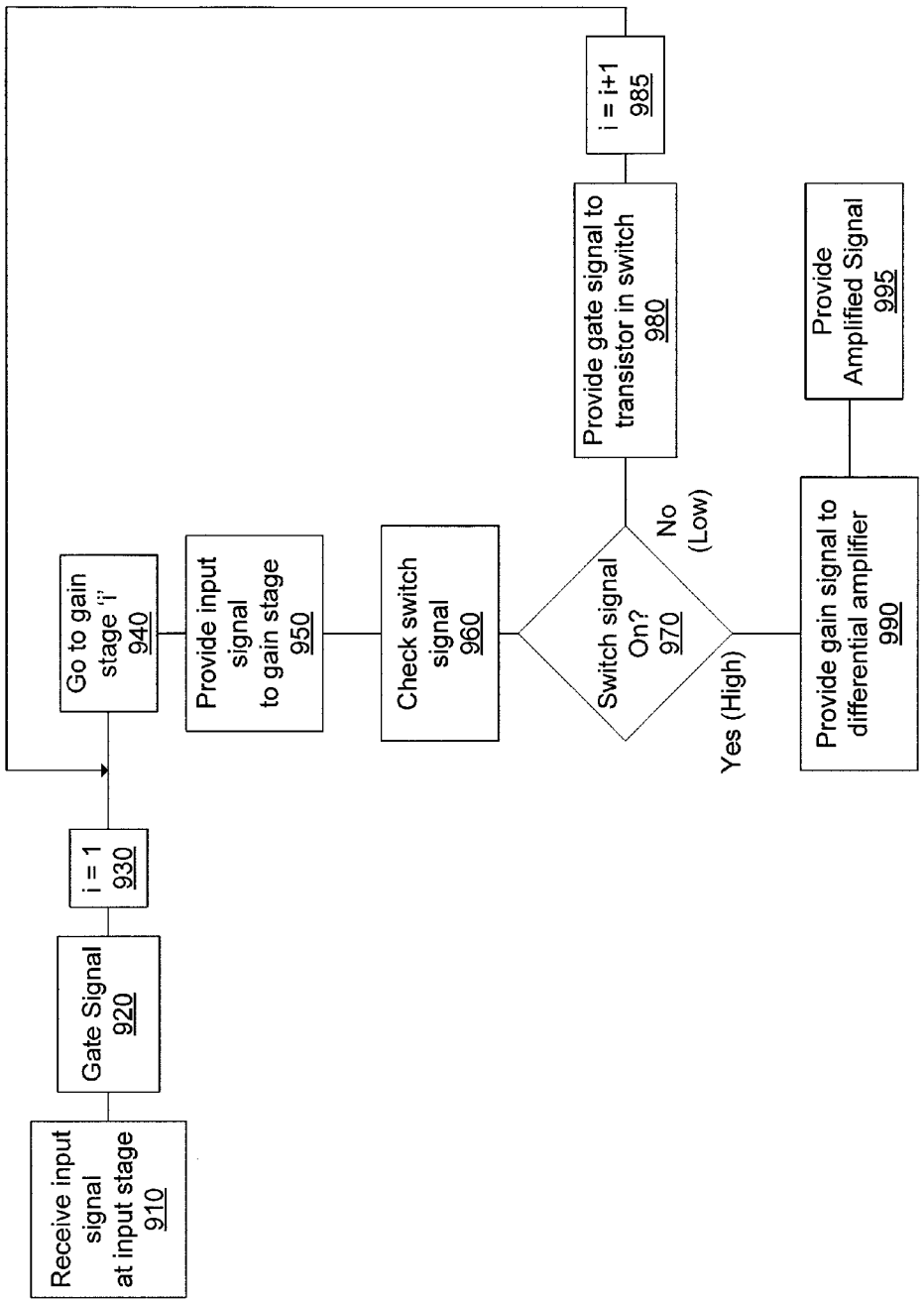
FIG. 9 shows a flow chart for a method of using a switch in a programmable gain amplifier, according to some embodiments.

FIG. 9 shows a flow chart for a method for using a switch in a PGA, according to some embodiments. The method for using a switch in a PGA may be executed by using a processor chip 790 coupled to the PGA, executing commands stored in a memory device coupled to the processor. The method depicted in FIG. 9 may be performed using PGA 770 (cf. FIG. 7 above), or any other circuit suitable to perform the steps depicted in FIG. 9. A PGA circuit able to perform the steps in FIG. 9 may include an input stage and a number 'n' of gain stages, where 'n' is any integer number. For example, n=4 in PGA 770, according to the embodiment depicted in FIG. 7. Furthermore, each of the gain stages may include a transistor-based switch to couple an input signal to a gain signal. For example, a switch in gain stage 'i' may use a transistor such as transistor 350-$i$ in PGA 770 (cf. FIG. 7), where 'i' is an integer between 1 and 'n.' A PGA circuit able to perform the steps depicted in FIG. 9 may also include a differential amplifier circuit that uses a gain signal to provide an amplified output signal. For example, a differential amplifier circuit such as circuit 160 in PGA 770 may be used (cf. FIG. 7).

In step 910 an input signal is received at the input stage of a PGA circuit. In some embodiments, the input signal may be as $V_{Si}$ 571 (cf. FIG. 5). In step 920, the input stage generates a gate signal from the input signal. For example, a gate signal provided by the input stage may be such as $V_{Gi}$ 591 (cf. FIG. 5) when a switch signal is 'low.' In step 930 an iteration parameter 'i' is set to one (i=1) by processor chip 790. Iteration parameter may vary from 1 to 'n,' where 'n' is the number of gain stages in the PGA circuit according to some embodiments. In step 940 the 'i-th' gain stage is selected. In step 950 an input signal is provided to the gain stage. In step 960 a switch signal for the 'i-th' gain stage is checked. For example, a switch signal may be as signal 100-i provided to the 'i-th' gain stage in PGA 770 (cf. FIG. 7). In step 970, a decision is made whether or not the switch signal for the 'i-th' gain stage is 'on' ('High') or 'off' ('Low').

If the switch signal is 'off,' the gate signal generated in step 920 is provided to the transistor in the switch included by the 'i-th' gain stage, in step 980. This step will produce the effect of turning the switch in the 'i-th' gain stage 'off.' This may effectively remove the 'i-th' gain stage from the signal amplification in the PGA. Iteration parameter is incremented by one in step 985 by processor chip 790, and the steps are repeated from step 940 until iteration parameter 'i' reaches the value 'n.' If the switch signal in step 970 is 'on,' the gain signal from the 'i-th' gain stage is provided to the differential amplifier in the PGA circuit in step 990. Thus, an amplified output signal is generated by the differential amplifier in step 995.

Embodiments described herein are exemplary only. One skilled in the art may recognize various alternative embodiments from those specifically disclosed. Those alternative embodiments are also intended to be within the scope of this disclosure. As such, the embodiments are limited only by the following claims.

What is claimed is:

1. A switch circuit, comprising:
   a first transistor having a source terminal to accept an input signal, a drain terminal to provide an output signal, and a gate;
   a power supply providing a first gate voltage; and
   a circuit to couple a switch signal to the gate, wherein the circuit turns the first transistor 'off' for all values of the input signal when the switch signal is 'low' and wherein the circuit to couple the switch signal to the gate comprises:
      a second transistor coupling the first gate voltage to the gate of the first transistor;
      third and fourth transistors coupled to an input node and an output node, wherein:
         the input node is coupled to the source terminal of the first transistor and a drain of the third transistor;
         a gate and a source of the third transistor and a source of the fourth transistor are coupled to the output node;
         a gate of the fourth transistor is coupled to the input node; and
         a drain of the fourth transistor is coupled to ground;
      a fifth transistor coupling the gate of the first transistor to the output node; and
      a first inverter coupled to a gate of the second transistor and to a gate of the fifth transistor, the switch signal being provided through the first inverter.

2. The circuit of claim 1, wherein the power supply providing a first gate voltage is coupled to a source of the second transistor and the gate of the first transistor is coupled to a drain of the second transistor.

3. The circuit of claim 1, wherein the first transistor is an NMOS transistor.

4. The circuit of claim 1, wherein the second transistor is a PMOS transistor.

5. The circuit of claim 1, wherein the third transistor and the fourth transistor are NMOS transistors.

6. The circuit of claim 2, wherein substrates of the first and fifth transistors are coupled to the output node and a substrate of the second transistor is coupled to the source of the second transistor.

7. The circuit of claim 6, wherein:
   the output node is coupled to ground by a first resistor, and to a source of the fifth transistor through a second resistor.

8. The circuit of claim 7, further comprising a second inverter and a second power supply wherein:
   the second inverter is coupled to the gate of the fifth transistor; and
   the second power supply provides a second gate voltage to the fifth transistor.

9. The circuit of claim 8, wherein the second gate voltage is lower than the first gate voltage.

10. A programmable gain amplifier, comprising:
    an input stage having an input node to couple an input signal, and an output node to provide a gate signal;
    at least one gain stage to provide a gain signal using the input signal, including a resistor and a switch circuit to activate the at least one gain stage and provide a gain signal using a switch signal; and
    a differential gain amplifier to provide an output signal from the gain signal;
    and further wherein:
       the resistor in the at least one gain stage is directly coupled to the input node in the input stage and the gate signal at the output node is coupled to the switch circuit in the at least one gain stage so that the switch circuit is 'off' for all values of the input signal when the switch signal is 'low.'

11. The programmable gain amplifier of claim 10, wherein the at least one gain stage comprises a plurality of gain stages each including a resistor and a switch circuit to activate the gain stage and provide a gain signal using a switch signal; and
    the resistor in each gain stage is coupled to the resistor in a prior gain stage; and
    the gate signal in the output node of the input stage is coupled to the switch circuit in each gain stage so that the switch circuit is 'off' for all values of the input signal when the switch signal is 'low.'

12. The programmable gain amplifier of claim 10, wherein the switch circuit comprises:
    a first transistor having a source terminal to accept the input signal, a drain terminal to provide the gain signal, and a gate;
    a power supply providing the gate voltage; and
    a circuit to couple the switch signal and the gate signal to the gate of the first transistor.

13. The programmable gain amplifier of claim 10, wherein the input stage comprises a first and a second transistor, a drain of the first transistor coupled to the input node and a drain of the second transistor coupled to ground; and
    a source of the first transistor, a gate of the first transistor, and a source of the second transistor are coupled to the output node.

14. A method for using a processor chip to control a switch in a programmable gain amplifier (PGA) including an input stage, at least one gain stage including a switch and a transistor, and an amplifier, the method comprising the steps of:

receiving, at the input stage of the PGA, an input signal;
generating, by the PGA, a gate signal from the input signal;
setting an iteration parameter to one by the processor chip;
selecting a gain stage of the PGA based on the iteration parameter;
providing the input signal to the at least one gain stage of the PGA;
determining whether a switch signal is 'on' or 'off' for the selected gain stage of the PGA;
if the switch signal is 'off,' providing the gate signal to the transistor in the switch of the selected gain stage of the PGA to turn the switch 'off' and increasing the iteration parameter by one and selecting the next gain stage by the processor chip until all gain stages in the PGA have been selected;
if the switch signal is 'on,' providing a gain signal to the amplifier in the PGA circuit from the selected gain stage.

* * * * *